United States Patent [19]
Opris et al.

[11] Patent Number: 6,097,326
[45] Date of Patent: Aug. 1, 2000

[54] ALGORITHMIC ANALOG-TO-DIGITAL CONVERTER WITH REDUCED DIFFERENTIAL NON-LINEARITY AND METHOD

[75] Inventors: Ion E. Opris, Cupertino; Sing W. Chin, Alameda; Bill C. Wong, Milpitas; Satoshi Sakurai, San Jose, all of Calif.

[73] Assignee: National Semiconductor Corporation, Santa Clara, Calif.

[21] Appl. No.: 09/084,543

[22] Filed: May 26, 1998

[51] Int. Cl.[7] ........................................ H03M 1/38
[52] U.S. Cl. ............................. 341/161; 341/118
[58] Field of Search ..................... 341/161, 118, 341/120, 156, 158, 162, 163, 172

[56] References Cited

U.S. PATENT DOCUMENTS

| | | | |
|---|---|---|---|
| 4,746,903 | 5/1988 | Czarniak et al. | 340/347 DA |
| 5,047,772 | 9/1991 | Ribner | 341/156 |
| 5,572,212 | 11/1996 | Levinson et al. | 341/162 |
| 5,594,445 | 1/1997 | Ginetti | 341/162 |
| 5,644,308 | 7/1997 | Kerth et al. | 341/120 |
| 5,668,549 | 9/1997 | Opris et al. | 341/118 |

OTHER PUBLICATIONS

IEEE Transactions on Circuits and Systems—II: Analog and Digital Signal Processing, vol. 42, No. 7, Jul., 1995, A Pipelined A/D Conversion Technique with Near–Inherent Monotonicity, Paul C. Yu and Hae–Seung Lee; pp. 500–502.
IEEE Journal of Solid–State Circuits, vol. 31, No. 12, Dec., 1996, A 2.5– V, 12–b, 5–MSample/s Pipelined CMOS ADC, Paul C. Yu, Member, IEEE, and Hae–Seung Lee, Fellow, IEEE; pp. 1854–1861.

*Primary Examiner*—Howard L. Williams
*Assistant Examiner*—Jean B. Jeanglaude
*Attorney, Agent, or Firm*—Limbach & Limbach L.L.P.

[57] ABSTRACT

An analog to digital converter section for use in an analog to digital converter which includes a converter stage which produces a digital and an residue output. The residue output is applied to an over-range stage which produces a second residue output equal to the first residue output reduced in magnitude by the magnitude of a reference voltage. The over-range stage is capable of operating with a relatively high feedback factor to increase operating speed and with commutated feedback-capacitor switching to reduce differential non-linearity errors.

20 Claims, 11 Drawing Sheets

ALGORITHMIC ANALOG-TO-DIGITAL CONVERTER WITH REDUCED DIFFERENTIAL NON-LINEARITY AND METHOD

BACKGROUND OF THE INVENTION

1. Field of the Invention

The present invention relates generally to analog-to-digital converters (ADCs) and in particular, to high speed algorithmic ADCs having over-range correction.

2. Description of the Related Art

Algorithmic ADCs are categorized as either pipelined or cyclic. Pipelined ADCs are commonly used in low- power, high speed applications. A typical pipelined architecture uses a number of similar stages connected in series. A cyclic ADC is typically includes two similar stages, with the final stage output connected back to the initial stage input.

Referring to the drawings, FIG. 1 depicts a single stage 20 of a conventional pipelined ADC. Each stage produces K number of bits ($D_1$–$D_K$) so that an ADC having J number of stages will produce J*K number of bits N. FIG. 2 depicts an ADC having a multiple stages, including three stages 20A, 20B and 20C, with each stage producing a single bit $D_1$–$D_3$, respectively.

Each converter stage 20 (FIG. 1) includes a sample and hold circuit (S/H) 22 which receives the analog input $Vres_{i-1}$ and produces an output $Vres_i$. The output $Vres_i$, sometimes referred to as the residue voltage, is fed to the following stage which produces a residue voltage $Vres_{i+1}$. For the input stage 20A (FIG. 2), the input voltage Vin is represented by $Vres_{i-1}$ and the output voltage is represented by $Vres_i$.

The output of the sample and hold circuit 22 is fed to a an analog-to-digital subconverter circuit (ADSC) 26A having a K bit output. Typically, the ADSC circuit 26A is implemented using comparator circuits which compares $Vres_{i-1}$ to a reference voltage Vref. By way of example, stage 20A (FIG. 1) produces a single bit (K=1) and utilizes a single comparator which compares $Vres_{i-1}$ (Vin) with a reference voltage and provides an output $D_1$ which is either +1 or –1 depending on the magnitude of $Vres_{i-1}$. Typically, $Vres_{i-1}$ can vary between –Vref and +Vref so that the reference used by the comparator is the mid-point between the reference voltages which is nominally 0 volts.

The digital output of the ADSC 26A is converted to an analog voltage by a DAC 28A having K input bits. The output voltage of DAC 28A is subtracted from voltage $Vres_{i-1}$ held by the sample and hold circuit 22 by adder 24. The difference output of adder 24 is multiplied by an amplifier stage 30A having a gain of $2^K$. The amplifier output $Vres_i$ is forwarded to a subsequent stage 20 which provides additional analog and digital outputs based upon the magnitude of $Vres_i$. As will be explained later in greater detail, each stage typically alternates between two modes of operation, including a sample phase followed by an amplification phase. When a stage 20A (FIG. 2) is in an amplification phase, the subsequent stage 20B will be in the sample phase. The magnitude of the residue voltage $Vres_i$ at the end of the amplification phase can be calculated by the following equation, where $Vdac_i$ is the output of DAC 28A:

$$Vres_i = 2^K(Vres_{i-1} - Vdac_i) \quad (1)$$

As previously noted, a cyclic ADC includes two stages similar to that of FIG. 1, each of which alternates between a sample and an amplification phase. The input voltage is applied to the first stage which produces a first residue voltage and a first digital output. The first stage forwards the residue voltage to the second stage, with the second stage generating a second residue voltage and a second digital output. The second residue voltage is fed back to the input of the first stage where the first stage produces a third residue voltage and third digital output. The residue voltage is recirculated in this manner until the desired number of bits are produced.

The central problem with any algorithmic ADC is that the overall linearity of the ADC is determined by the linearity of DAC 28A. An attractive solution, especially for high speed applications, is to use a one bit (K=1) ADSC 26A and DAC 28A. With a single bit decision, there is always a straight line that can be drawn between the positive and negative references. As indicated by equation (1), when K=1, the ideal gain of the converter stage is two. This is demonstrated by the following equation derived from equation (1):

$$Vres_i = 2 \cdot Vres_{i-1} - D_i \cdot Vref \quad (2)$$

Value $D_i$ is either ±1 and $Vres_{i-1}$ has a minimum value of –Vref and a maximum value of +Vref. FIG. 3 depicts an ideal one bit per stage residue transfer function. The transfer function includes a single transition at Vref=0 and a nominal gain of 2.

FIG. 4 is a conventional circuit typically used to provide the one bit per stage residue transfer function of FIG. 3. The stage is shown as a single ended stage in order to simplify the description of operation. However, as is well known, such stages are usually actually implemented in fully differential form where there are differential input residue voltages and differential output residue voltages.

The single ended FIG. 4 stage includes a pair of capacitors C1 and C2, which are nominally of the same value, and an operational amplifier 32. Switches S1A, S1B, S1C, S2A and S2B are provided which are implemented using transistors and are controlled by two non-overlapping clocks.

During the sample phase, one of the clocks causes switches S1A, S1B and S1C to be turned on, with switches S2A and S2B remaining off. The equivalent circuit is shown in FIG. 5A. Amplifier 32 is configured as a voltage follower (unity gain), with the input voltage $Vres_{i-1}$ being applied to one side of both capacitors C1 and C2. Since the inverting input of amplifier 32 is nominally at ground potential due to feedback, the entire input voltage $Vres_{i-1}$ is applied across the parallel combination of capacitors C1 and C2.

During the amplification phase following the sampling phase, switches S1A, S1B and S1C are turned off and switches S2A and S2B are turned on. The equivalent circuit is shown in FIG. 5B. Capacitor C2 is connected between the inverting input and the output of amplifier 32 and one side of capacitor C1 is connected to either +Vref or –Vref depending upon bit $D_i$. As can be explained by the principle of conservation of charge, at the termination of the amplification phase, the output voltage $Vres_i$ will nominally be equal to twice input $Vresi_1$ plus Vref when $D_i$=+1 and twice input $Vres_{i-1}$ minus Vref when $D_i$=–1. Thus, the nominal transfer characteristics shown in FIG. 3 are achieved.

Taking into account various sources of error, the output voltage $Vres_i$ is more accurately determined by the following equation:

$$Vres_i = ((2+a\alpha_i) \cdot Vres_{i-1} - (1+\alpha_i) \cdot D_i \cdot Vref) \cdot (1-\epsilon_i) + Vofs_i \quad (3)$$

As can be seen from equation (3), the actual output voltage $Vres_i$ is affected by $\alpha_i$, the capacitor mismatch between C1 and C2, ei, the error due to finite open loop gain of amplifier 32 and settling, and $Vofs_i$, representing a total offset term due to the charge injection effects and amplifier 32 input offset.

The converter stage errors noted in connection with equation (3)affect the linearity of the overall ADC. Some of the errors attributable to amplifier 32 can be minimized by careful amplifier design. However, there is a technological limit to reducing the error due to capacitor mismatches. For resolution higher than ten bits, several calibration/correction techniques have been developed to address capacitor mismatch.

The relative accuracy of an ADC is the deviation of the output from a straight line drawn through zero and full scale. Such relative accuracy is sometimes referred to as integral non-linearity error. Differential non-linearity (DNL) error describes the difference between two adjacent analog input signal values compared to the step size. For certain applications such as digital imaging, only the DNL is critical. A commutated feedback capacitor switching technique has been developed to reduce the DNL even for relatively large capacitor mismatches. This technique relies on the observation that the DNL is determined by the height of the transition gap in the transfer characteristic. As shown in the idealized transfer curve of FIG. 3, the height $V_D$ is 2Vref at the transition between $D_i=+1$ and $D_i=-1$.

The significance of the height $V_D$ can be best appreciated by considering an input voltage $Vres_{i-1}$ having a magnitude very slightly less than transition voltage (0 volts) and an input voltage very slightly greater that the transition voltage. In order to achieve the desired DNL, the output of the ADC should change no more than one LSB for the slight change in input voltage. However, since the difference in capacitor values represented by $\alpha_i$ are random errors which cannot be reduced to an insignificant value in high resolution ADCs, the approach depicted in FIG. 4 cannot be used in such applications.

A prior art commutated feedback-capacitor switching (CFCS) technique has been developed to maintain a high DNL despite the presence of a significant capacitor mismatch. The FIG. 4 circuit is modified to include additional switches so that, during the amplification phase, capacitors C1 and C2 are reversed in the circuit depending upon the state of bit $D_i$. The equivalent circuit during the sample phase remains the same as shown in FIG. 5A. However, the equivalent circuit during the amplification stage is changed from FIG. 5B to the circuit shown in FIG. 6. When $D_i=+1$, capacitor C1 is connected as the input capacitor and C2 is connected as the feedback capacitor. When $D_i=-1$, the two capacitors are switched so that C2 is connected as the input capacitor and Cl functions as the feedback capacitor.

FIG. 7 shows the transfer curve when CFCS is utilized. Neglecting the errors due to amplifier 32 settling time and finite gain, the output voltage in the region $D_i=-1$ is given by the following equation:

$$Vout = \left(\frac{C_1 + C_2}{C_1} \cdot Vin + \frac{C_2}{C_1} \cdot Vref\right) + Vofs_i \quad (4)$$

Similarly, the output voltage when Di=+1 is given by the following equation:

$$Vout = \left(\frac{C_1 + C_2}{C_2} \cdot Vin - \frac{C_1}{C_2} \cdot Vref\right) + Vofs_i \quad (5)$$

The magnitude of $V_D$ is calculated by subtracting the value of Vout for Vin=0, in accordance with equation (4), from the value of Vout for Vin=0, in accordance with equation (5). The result $V_D$ ($\Delta Vout_{Vin=0}$) is as follows:

$$\Delta Vout_{Vin=0} = \left(\frac{C_1}{C_2} + \frac{C_2}{C_1}\right) \cdot Vref \approx \left(2 + \frac{\alpha_i^2}{2}\right) \cdot Vref \quad (6)$$

It can be seen from equation (5) that $V_D$ ($\Delta Vout_{Vin=0}$) is equal to 2Vref up to a second order error term.

Another major issue for any algorithmic ADC is the linear range in the analog domain. The description of prior art converters so far has assumed that all of the analog stages have been operating in the linear range. However, the linear range is limited by the circuit characteristics and is, in no case, greater than the power supply voltage. For a converter architecture which has only 1-bit conversion stages, should the analog residue in one stage be outside the −Vref to +Vref range, such analog residue will be amplified by 2 at each subsequent stage and eventually reach a limiting region of the output voltage at a later stage. This situation results in an erroneous ADC output.

One solution is to use one or more over-range stages capable of operating with analog inputs greater than −Vref to +Vref. Examples of the prior art two bits per stage approach are described in "A Pipelined A/D Conversion Technique With Near-Inherent Monoticity" by Paul C. Yu, et al., IEEE Transactions On Circuits and Systems II, Vol. 42, July, 1995, pp. 500–502 and in "A 2.5 V, 12-B, 5-MSample/s Piplelined CMOS ADC" by Paul C. Yu et al., IEEE Journal of Solid State Circuits, Vol. 31, December 1996, pp. 1854–1861. Examples of the over-range circuits are disclosed in U.S. Pat. No. 5,668,549 entitled "Radix 2 Architecture and Calibration Technique For Pipelined Analog To Digital Converters" which issued on Sep. 16, 1997. The contents of the two IEEE publications and U.S. Pat. No. 5,668,549 referenced above are hereby fully incorporated herein.

FIG. 8 depicts an exemplary prior art over-range circuit which produces two bits per stage. FIG. 9 is the residue transfer function of the FIG. 8 circuit. Although not depicted in FIG. 8, three comparator circuits are used to determine the two bit digital code based upon input Vin which further defines the three transition points (−Vref, 0, +Vref) in FIG. 9 transfer function. During the sampling phase, switches S1A, S1B, S1C, S1D and S1E are closed so that amplifier 32 is configured for unity gain and so that voltage +Vref is applied to capacitor C0, −Vref is applied to capacitor C3 and the input $Vres_{i-1}$ is applied to both capacitors C1 and C2.

Table 1 below illustrates the operation of the FIG. 8 circuit when the circuit is in the amplification phase.

TABLE 1

| Region | Digital Code | C0 | C1 | C2 | C3 |
| --- | --- | --- | --- | --- | --- |
| Vin < −Vref | −1 | S2A | S4B | S4C | S1D |
| −Vref < Vin < 0 | 0 | S1A | S2B | S4C | S1D |
| 0 < Vin < +Vref | +1 | S1A | S3B | S2C | S1D |
| +Vref < Vin | +2 | S1A | S3B | S3C | S2D |

By way of example, when Vin is between −Vref and 0, Table 1 indicates that the comparators (not depicted) will generate digital code 0. As also indicated by Table 1, switch S1A (FIG. 8) will be turned on thereby connecting associated capacitor C0 to +Vref. Switch 2B will be turned on so as to connect capacitor C1 across amplifier 32 thereby providing feedback. Switches S4C and S1D are also turned on thereby connecting both capacitors C2 and C3 to −Vref. The result is that Vref/2 is added to the input voltage Vres$_{i-1}$ and the sum is multiplied by two to provide the transfer characteristics illustrated in FIG. 9. Operation when the digital code Di=+1 is similar, except that Vref/2 is subtracted from the input voltage Vres$_{i-1}$ and the difference is multiplied by two.

In the event an over-range condition exists where input voltage Vres$_{i-1}$ is less than −Vref (D$_i$=−1), −Vref is connected to capacitors C1, C2 and C3, with C0 being connected as the feedback capacitor. This causes 3/2Vref to be added to the negative input voltage Vres$_{i-1}$ and the sum to be multiplied by two. This causes the residue voltage to become positioned in-range thereby preventing over-ranging from occurring in subsequent stages. Further, the digital output code of −1 indicates that over-range correction has occurred thereby enabling well known over-range correction techniques to be used so that the output code of the ADC will be correct. Exemplary correction techniques are disclosed in previously cited U.S. Pat. No. 5,668,549.

In the event that input voltage Vres$_{1-i}$ is greater than Vref, digital code +2 is generated thereby indicating an over-range condition. As indicated by Table 1, switches S1A, S3B and S3C connect +Vref to capacitors C0, C1 and C2, respectively. Switch S2D connects capacitor C3 to the feedback position. This causes 3/2Vref to be subtracted from the input voltage Vres$_{i-1}$ and the difference to be multiplied by two so that the residue voltage will be in range. The digital code +2 is used for over-range correction. Note that for each of the four different digital codes, a different one of the four capacitors is placed in the feedback position thereby providing commutated feedback capacitor switching (CFCS) so as to compensate for capacitor mismatching and thereby achieving a low DNL error.

The major drawback to the FIG. 8 over-range stage is reduced operating speed due to the low feedback gain (C/4C or β=¼) compared with the normal conversion stage of β=½ (C/2C) of FIG. 4. Feedback gain is defined herein to mean that fraction of the amplifier output that is feed back to the input. For the same settling of the over-range stage, the amplifier 32 bandwidth requirements are also increased over the normal stage.

The present invention overcomes the above-described shortcomings of the prior art. An ADC stage is disclosed that provides both over-range correction and compensation for capacitor mismatching so as to provide a low DNL error and yet is capable of operating at significantly greater speeds than such prior art stages. These and other advantages of the present invention will become apparent to those skilled in the art upon a reading of the following Detailed Description of the Invention together with the drawings.

SUMMARY OF THE INVENTION

An analog to digital converter section which includes a converter stage followed by an over-range stage. The converter stage is configured to receive an analog input and to produce an digital output and a residue voltage output which is typically equal to the analog input reduced by an amount commensurate with the digital output of the converter stage.

The residue voltage is applied to an over-range stage which produces a further residue output indicative of the input residue voltage but reduced in magnitude by a fixed amount thereby reducing the likelihood of an over-range condition at a subsequent stage of the ADC. The over-range stage, which is switchable between a sampling phase and an amplification phase, includes an amplifier and first and second capacitors. The over-range stage is configured to connect the first capacitor to receive the residue voltage when the residue voltage is of one polarity and to connect the second capacitor to receive the residue voltage when the residue voltage is of an opposite polarity.

DETAILED DESCRIPTION OF THE INVENTION

Figure 10:
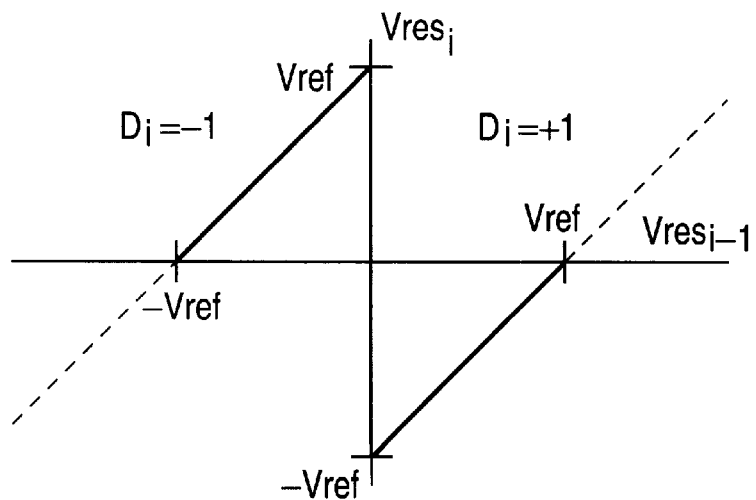
FIG. 10 is a residue transfer function produced by the over-range stage of the present invention.
Figure 11:
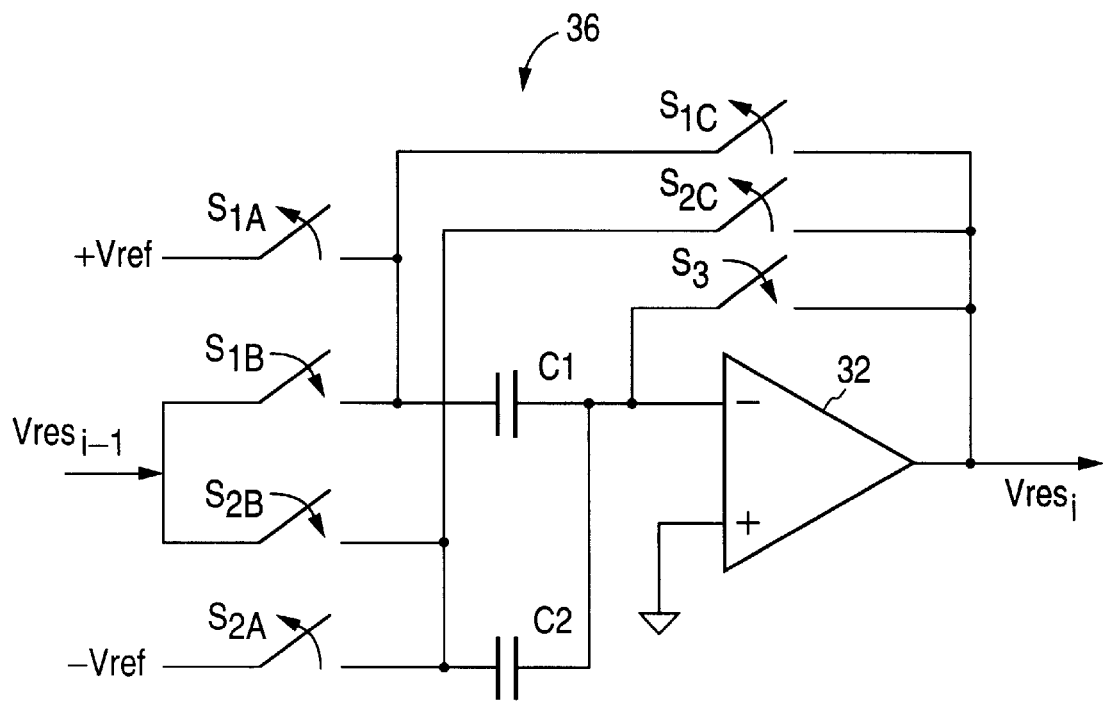
FIG. 11 is a schematic diagram of an over-range stage of the present invention capable of producing the FIG. 10 transfer function.

Referring again to the drawings, FIG. 11 shows an over-range stage generally designated by the numeral 36, in accordance with the present invention. The stage shown is a single ended embodiment so as to simplify the description, with the actual embodiment typically being fully differential. The residue transfer characteristics of the FIG. 11 over-range stage are shown in FIG. 10.

As can be seen from FIG. 10, the nominal gain is unity so that a high feedback gain can be maintained. An residue input to the over-range stage 36 (FIG. 11) outside −Vref to +Vref is converted back to the normal −Vref to +Vref range. The over-range stage 36 is configured in a manner which depends upon whether the input Vres$_{i-1}$ to the circuit is positive or negative. As will be explained later in greater detail, it is necessary to make this determination prior to the beginning of the sampling phase of the over-range stage.

In order to achieve a low differential non-linearity error (DNL), the height of the discontinuity in the residue transfer function (FIG. 10) should be as close as possible to 2Vref, as previously noted. In addition, a low DNL error requires that the end point coordinates of the transfer function at inputs −Vref and +Vref match as indicated by the following equation:

$$Vres_i(-\text{Vref}) \approx Vres_i(Vref) \tag{7}$$

Assuming that it has been determined that $Vres_{i-1}$ applied to circuit 36 will be a negative voltage, switches S1B, S2C and S3 are closed at the beginning of the sample phase. As shown by the equivalent circuit of FIG. 12A, these switch states cause amplifier 32 to be connected as a voltage follower, capacitor C2 to be shorted and capacitor C1 to be connected to the input voltage $Vres_{i-1}$. Thus, the input voltage is sampled on capacitor C1.

Figure 12A:
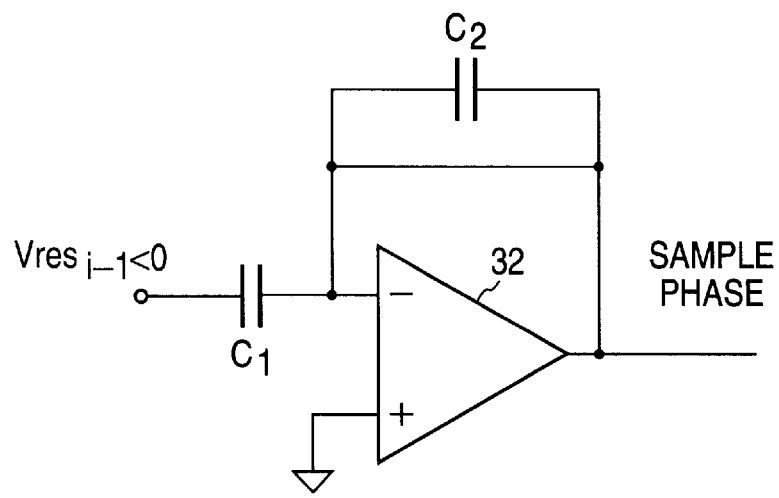
FIGS. 12A, 12B, 12C and 12D are simplified equivalent circuits of the FIG. 11 over-range stage illustrating the operation of the over-range stage.
Figure 12B:
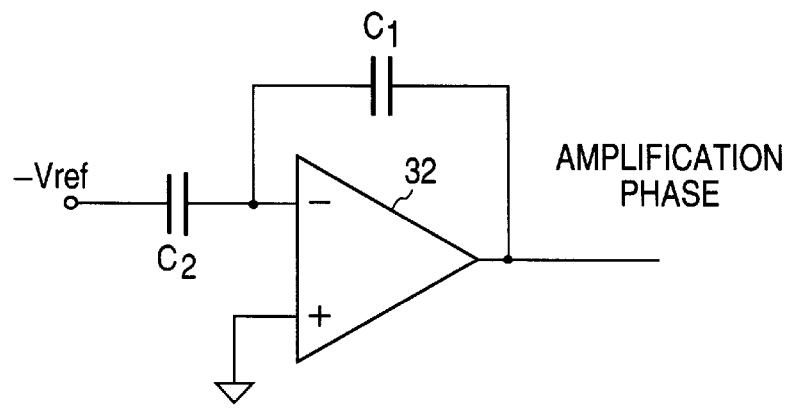

During the amplification phase following the sample phase, switches S1C and S2A are turned on so that capacitor C1 is connected in the feedback position as shown in the equivalent circuit of FIG. 12B and so that −Vref is applied to capacitor C2. The equation describing the output voltage of the over-range stage 36 at the end of the amplification phase is shown below.

$$Vout_I = \left(Vin + \frac{C_2}{C_1} \cdot Vref\right) + Vofs \tag{8}$$

Figure 12C:
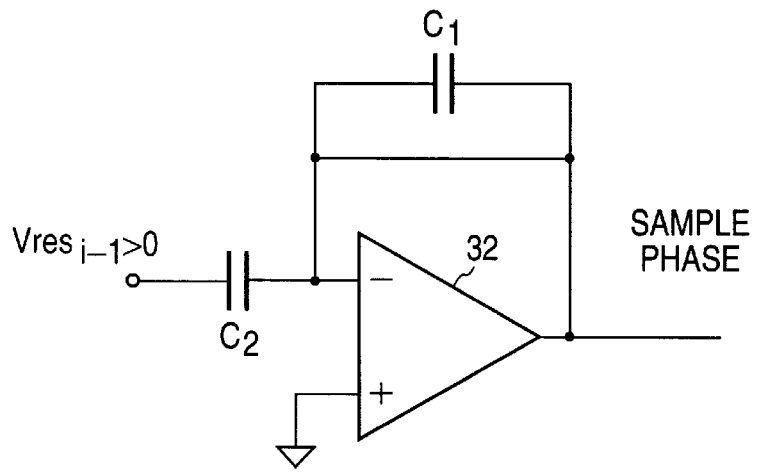
Figure 12D:
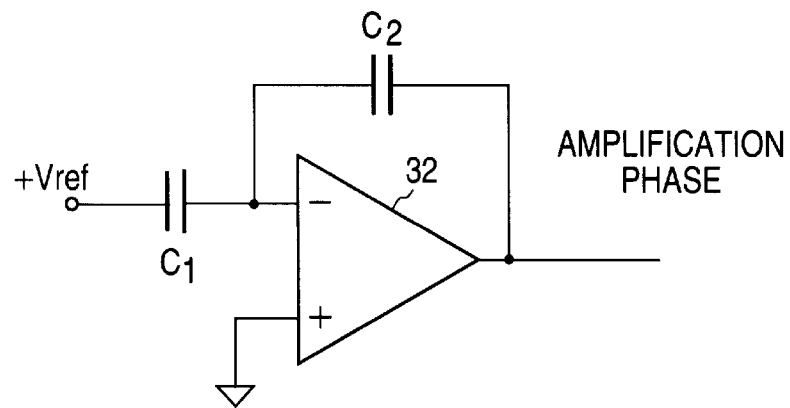

When it has been determined that the input voltage $Vres_{i-1}$ will be positive, the over-range stage 36 is configured so that switches S1C, S2B and S3 are closed in the sample phase. The equivalent circuit is shown in FIG. 12C. During the subsequent amplification phase, the switches S1A and S2C are closed so that +Vref is applied to the capacitor C1 and capacitor C2 is connected in the feedback position. The final output voltage is expressed as follows:

$$Vout_{II} = \left(Vin - \frac{C_1}{C_2} \cdot Vref\right) + Vofs \tag{9}$$

It can be seen for equations (8) and (9) that the two conditions for a low DNL error are maintained. First, the height of the transition gap remains close to 2Vref notwithstanding a mismatch between capacitors C1 and C2:

$$\Delta Vout_{Vin=0} = Vout_I(0) - Vout_{II}(0) \tag{10}$$

$$= \left(\frac{C_1}{C_2} + \frac{C_2}{C_1}\right) \cdot Vref \approx \left(2 + \frac{\alpha_i^2}{2}\right) \cdot Vref$$

Second, the difference between the end points where $Vres_i$ is equal to +Vref and −Vref remains close to the same value (zero):

$$\Delta Vout_{Vin=\pm Vref} = Vout_I(-Vref) - Vout_{II}(Vref) \tag{11}$$

$$= \left(\frac{C_1}{C_2} - \frac{C_2}{C_1}\right) \cdot Vref \approx \frac{\alpha_i^2}{2} \cdot Vref$$

Figure 1:
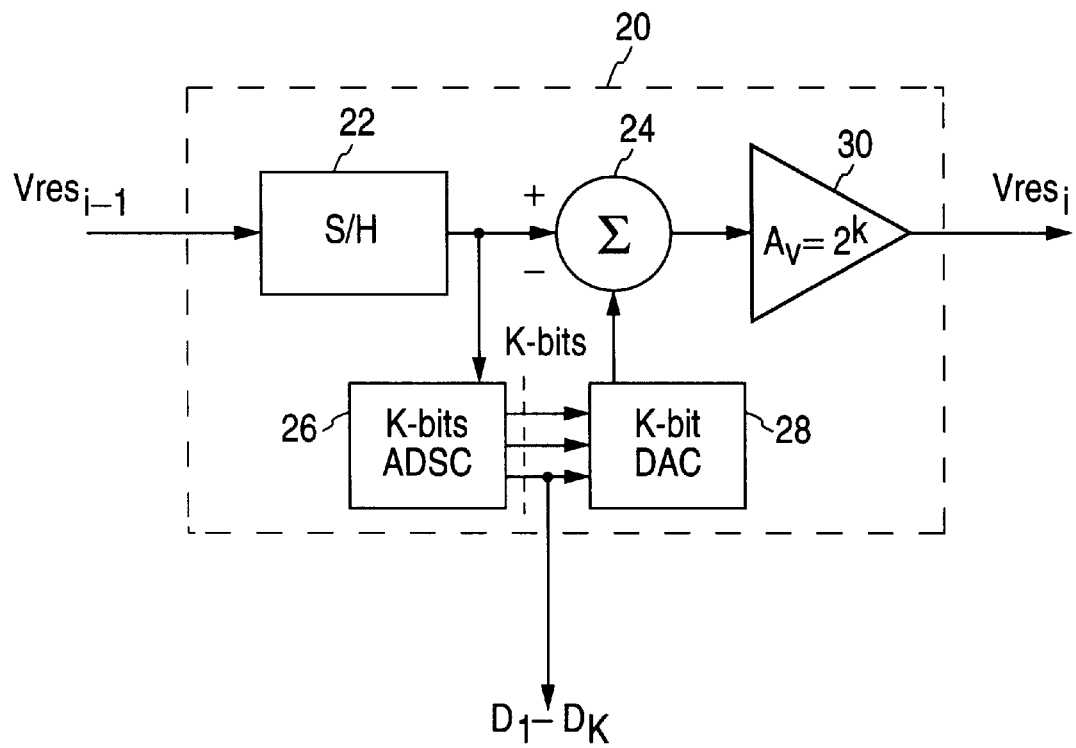
FIG. 1 is a block diagram of a single stage of a conventional pipelined analog-to-digital converter.
Figure 3:
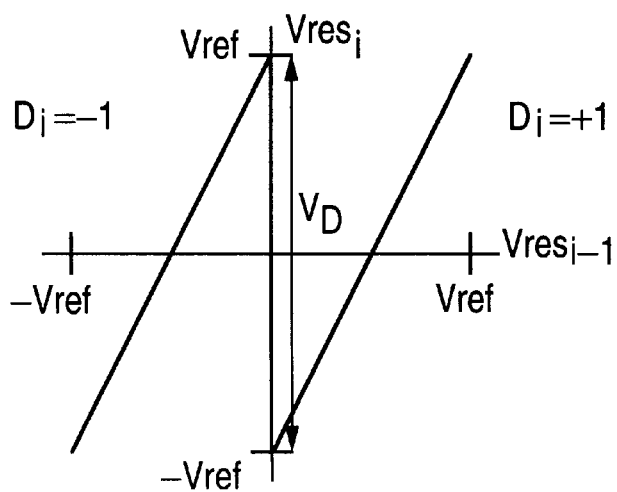
FIG. 3 is an idealized residue transfer function of a conventional converter stage as depicted in FIG. 1.
Figure 2:
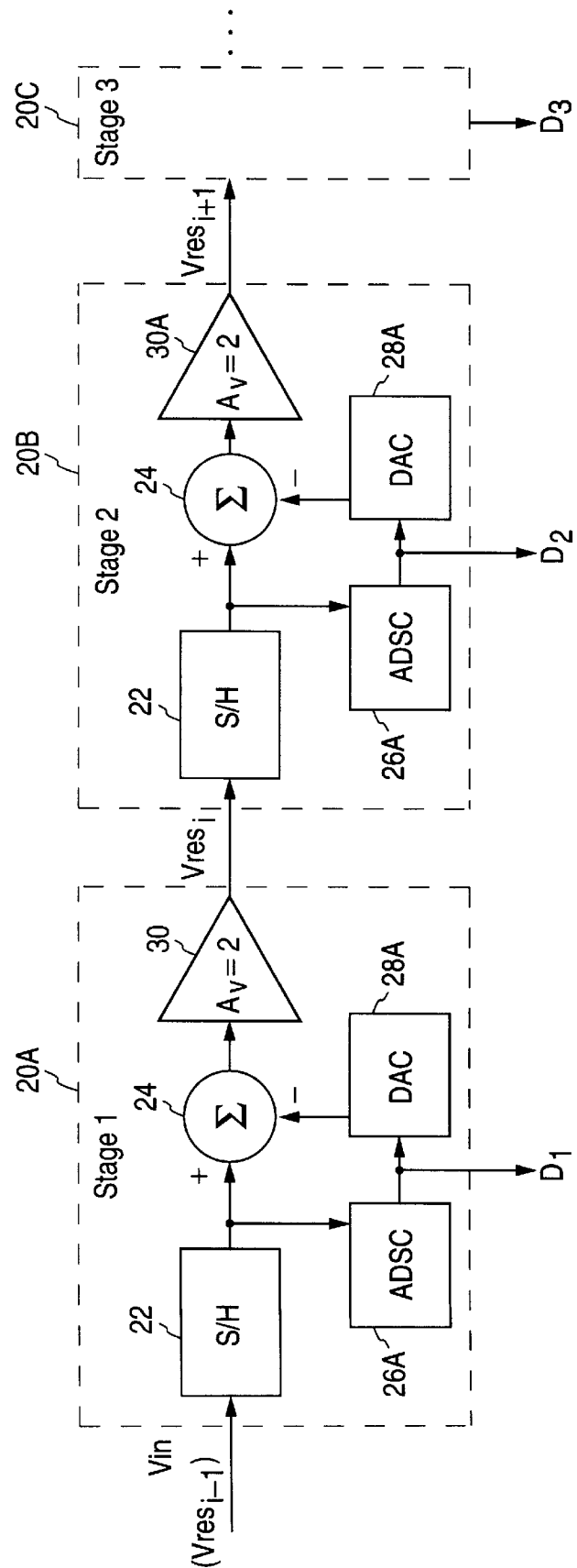
FIG. 2 is a block diagram of a conventional analog-to-digital converter utilizing the stages of FIG. 1.
Figure 4:
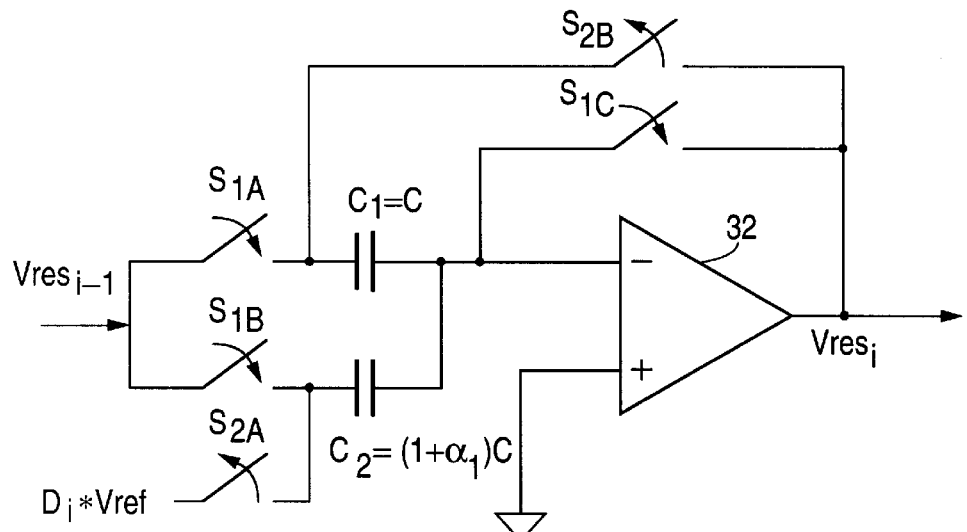
FIG. 4 is a schematic diagram of a conventional analog-to-digital converter stage.
Figure 5A:
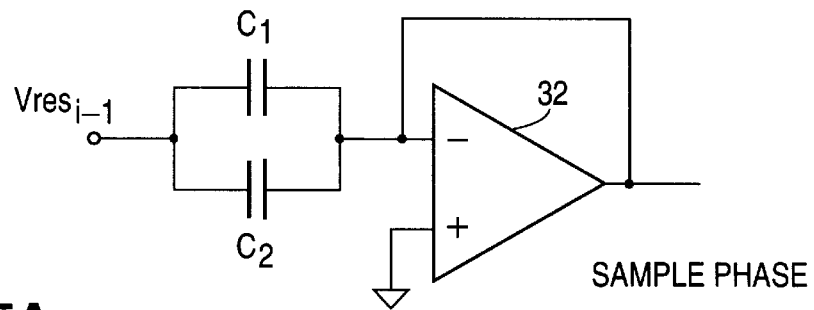
FIGS. 5A and 5B are simplified equivalent circuits of the FIG. 4 stage during the sample phase and amplification phase, respectfully.
Figure 5B:
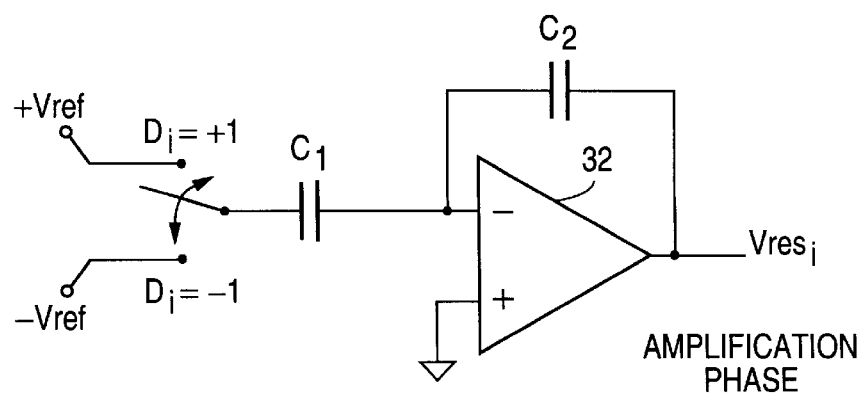
Figure 6:
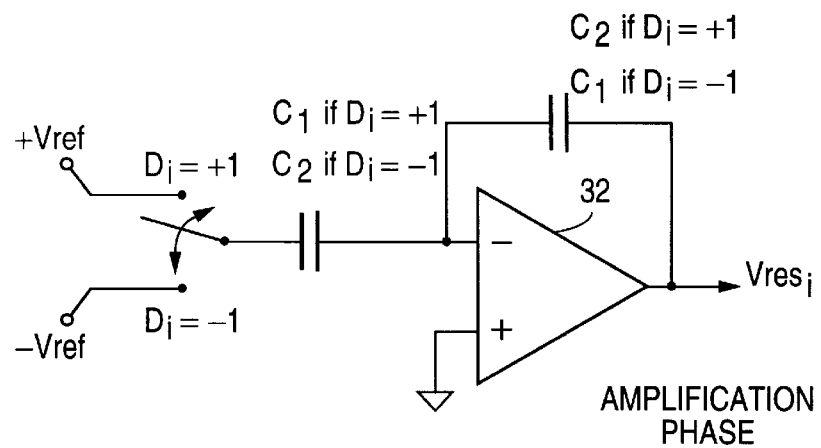
FIG. 6 is an equivalent circuit of a converter stage during the amplification phase utilizing a conventional commutated feedback capacitor technique.
Figure 7:
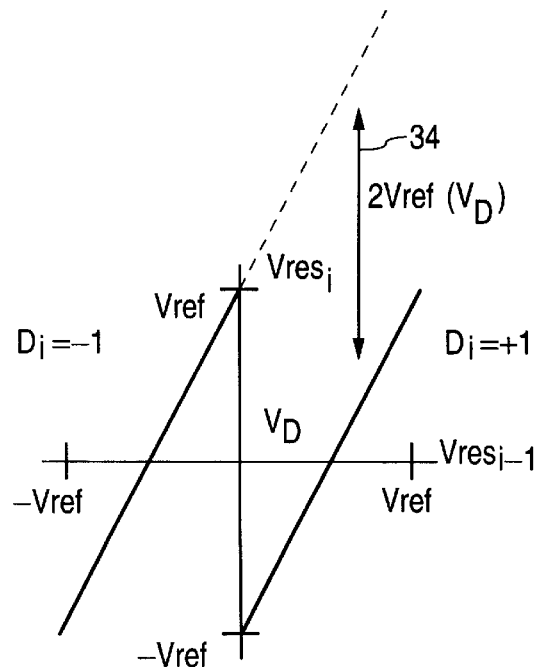
FIG. 7 is a conventional residue transfer function achieved using a commutated feedback capacitor technique so that differential non-linearity is maintained.
Figure 13:
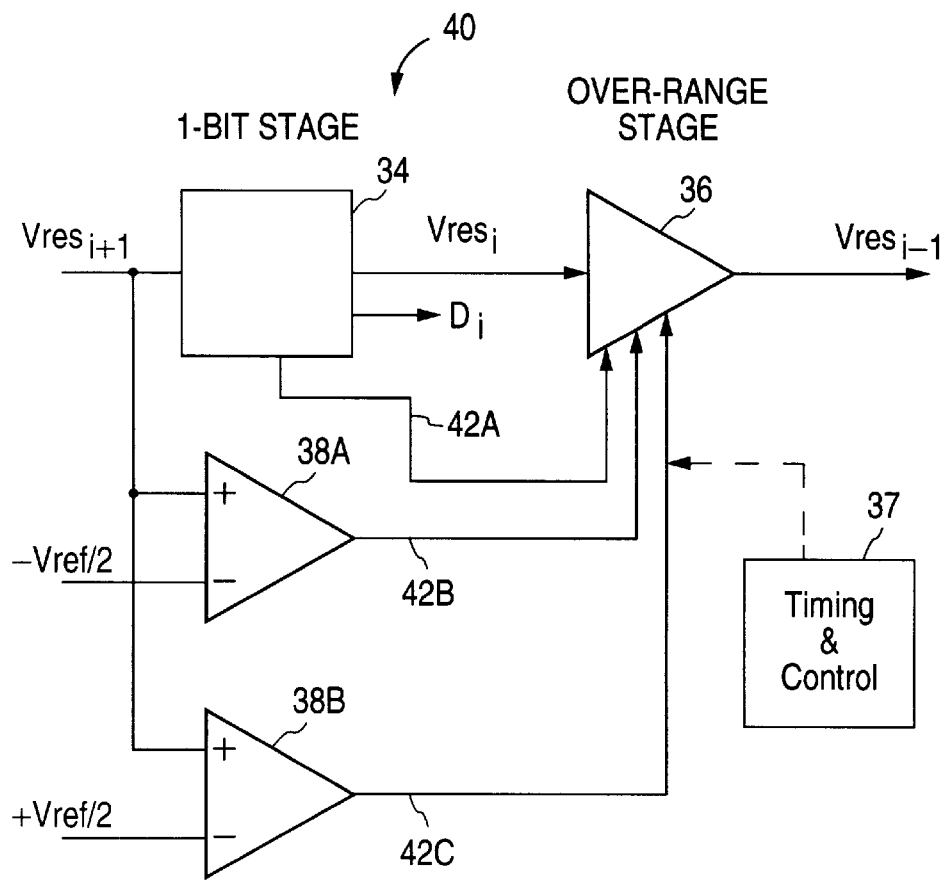
FIG. 13 is a block diagram of a converter section in accordance with the present invention.

FIG. 13 shows a converter section 40 which includes the over-range stage 36 in combination with a one bit converter stage 34 similar in construction to the conventional stage shown in FIG. 6. The residue transfer function of the converter stage 34 is shown in FIG. 3, with stage 34 producing a single bit $D_i$ generated by an internal comparator circuit (not depicted). Block 37 represents the circuitry for carrying out timing and control functions which, among other things, control the state of the various switches used in the converter stage 34 and the over-range stage 36. Based upon the present disclosure, the manner in which the block 37 circuitry would be implemented would be readily apparent to one of ordinary skill in the art, with the particular form of implementation forming no part of the present invention.

As previously explained, the over-range stage 36 is configured in a manner depending upon whether the input to the stage, $Vres_i$, is either positive or negative. As indicated by FIG. 12A, capacitor C1 is connected to receive $Vres_i$ when $Vres_i$ is negative and, as indicated in FIG. 12C, capacitor C2 is connected to receive input $Vres_i$ when $Vres_i$ is positive. Thus, the polarity of the input $Vres_i$ must be determined just prior to the sample phase of the over-range stage 36, with such sample phase commencing near the beginning of the amplification phase of the preceding converter stage 34. However, the output $Vres_i$ is not stable at this point in time. In order to determine what the polarity will be, the input residue $Vres_{i+1}$ to the converter stage 34 is monitored prior to the beginning of the sample phase of the over-range stage 36 as will be described.

Figure 14:
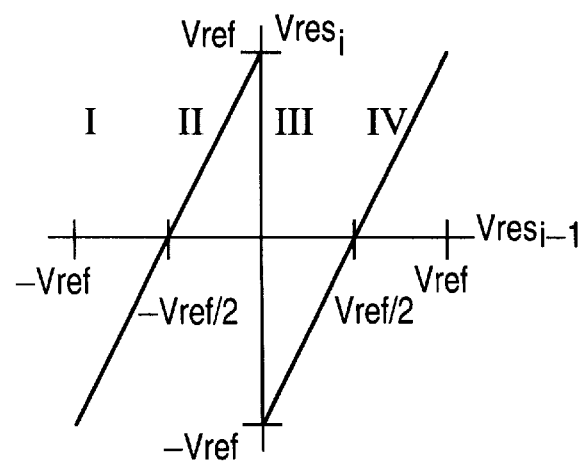
FIG. 14 is a residue transfer function produced by the converter stage portion of the FIG. 13 converter section.

FIG. 14 depicts the transfer function of converter stage 34, with four regions being identified. As can be seen from FIG. 14, the output $Vres_i$ of stage 34 will be positive when the residue input $Vres_{i+1}$ to the stage is between 0 and −Vref/2 and when the input is greater than +Vref/2. Similarly, the output $Vres_i$ will be negative when $Vres_{i+1}$ is less than −Vref/2 and when the output is both greater than 0 but less than +Vref/2. A converter internal to stage 34 (not depicted) for producing the digital output $D_i$ on line 42A provides the information as to the polarity of the input residue $Vres_{i+1}$. Two additional comparators 38A and 38B provide the additional information to determine the magnitude of the input relative to −Vref/2 and to +Vref/2. The three outputs on lines 42A, 42B and 42C thereby enabling the over-range stage 36 to predict the polarity of the converter stage 34 output $Vres_i$ prior to the beginning of the over-range stage 36 sample phase based upon the input $Vres_{i+1}$.

Figure 8:
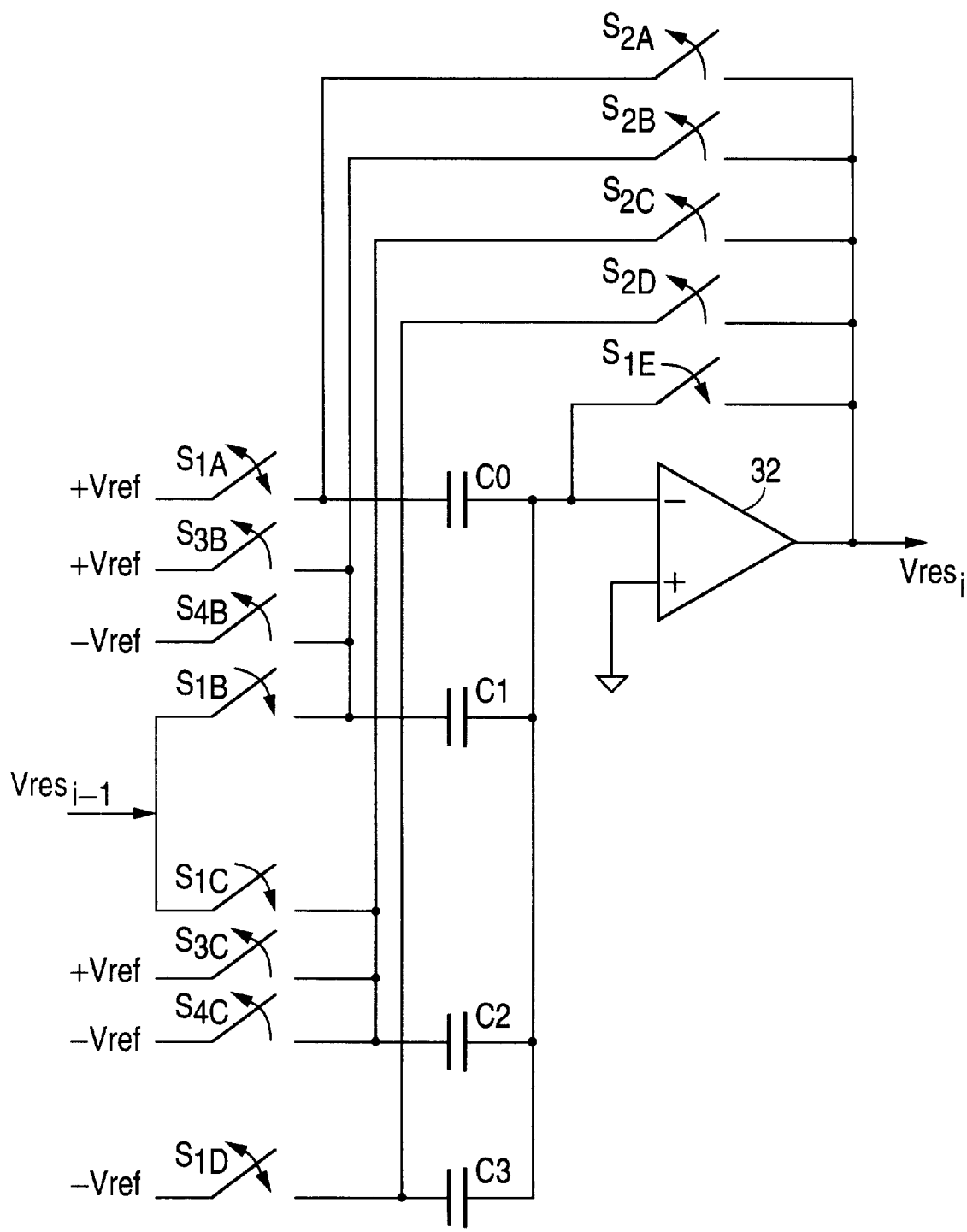
FIG. 8 is a schematic diagram of a conventional two bit converter stage providing over-range correction.
Figure 9:
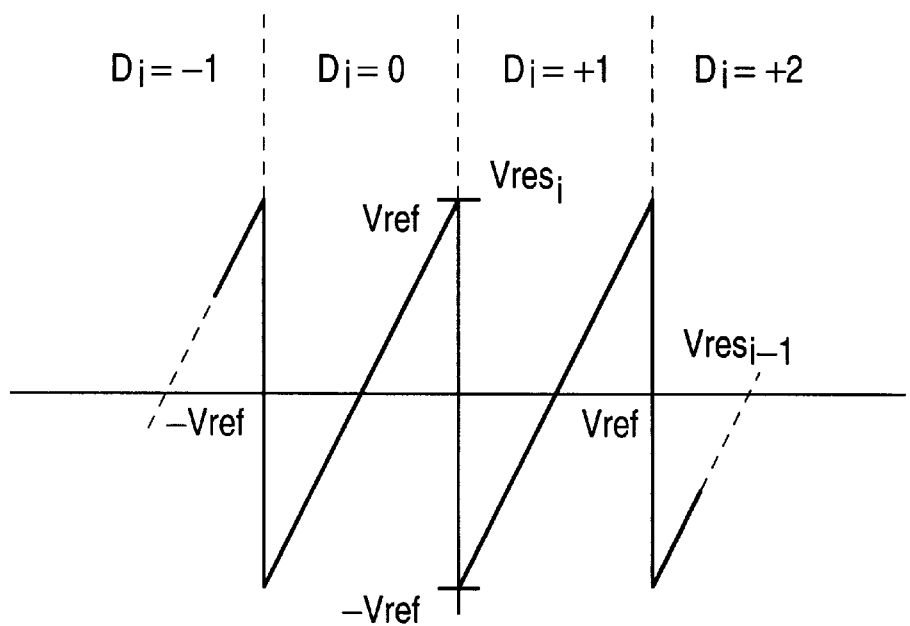
FIG. 9 is a residue transfer function provided by the converter stage of FIG. 8.

The converter section 40 of FIG. 13, which includes converter stage 34 in combination with the over-range stage 36, provides a residue transfer function like that of FIG. 9 produced by the circuit of FIG. 8. However, the converter stage 34 and the over-range stage 36 both have a feedback gain β of ½ as compared to the FIG. 8 gain of ¼. Assuming that the operational amplifiers used in the prior art converter stage and in the converter section 40 of the present invention have the same bandwidth, the converter section 40 of the present invention provides almost twice the achievable operating speed.

Figure 15:
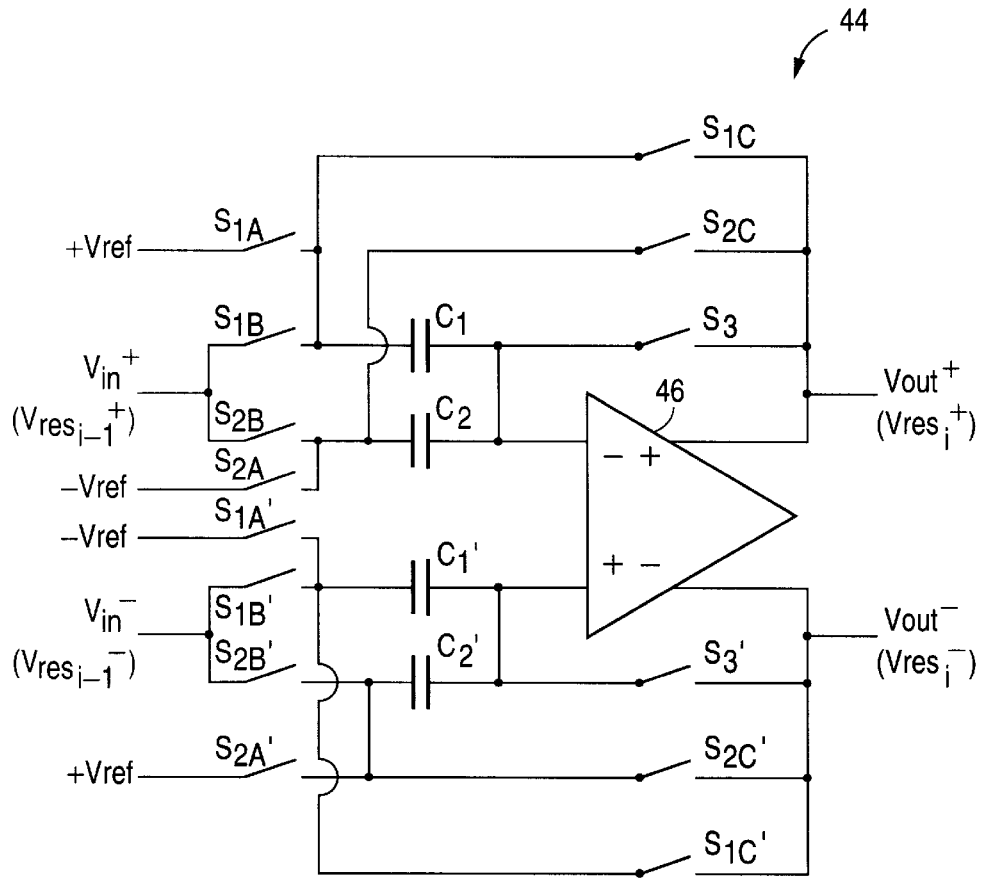
FIG. 15 is a fully differential implementation of the FIG. 11 over-range stage in accordance with the present invention.

As previously noted, although the various converter stages have been described using a single ended implementation to simplify the description, the actual implementation is usually a fully differential implementation. FIG. 15 depicts such a fully differential implementation of the FIG. 11 over-range stage 36, as indicated by the numeral 44. The FIG. 15 implementation includes a fully differential amplifier 46 which, by definition, includes a differential input and differential output. The previous converter stage (not depicted) provides a differential input $Vres_i+$ and $Vres_i-$ to the over-range stage. The over-range stage, in turn, provides differential outputs $Vres_i+$ and $Vres_i-$ to any subsequent converter stage.

Figure 16A:
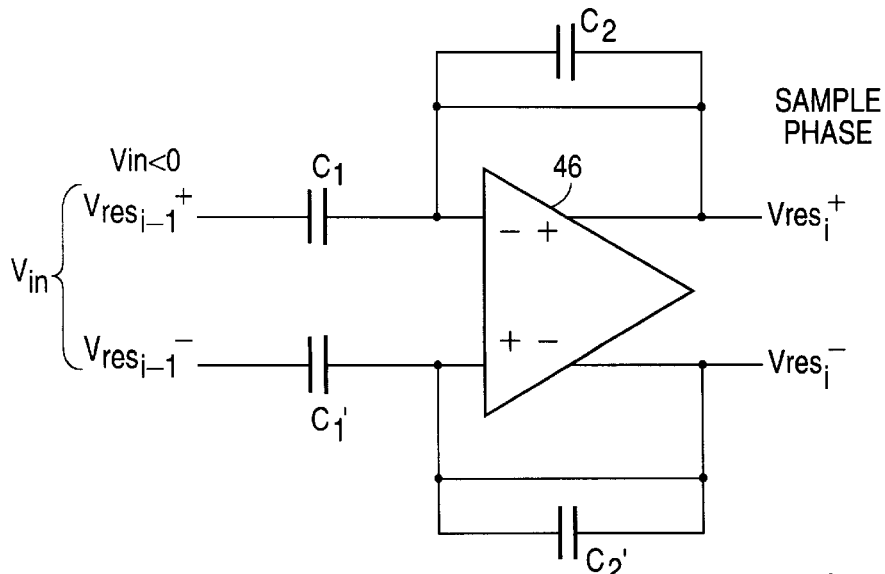
FIGS. 16A, 16B, 16C and 16D are simplified equivalent circuits of the FIG. 15 over-range stage illustrating the operation of the over-range stage.

The theory of operation of the fully differential implementation of FIG. 15 is the same as the single ended implementation of FIG. 11. Assuming that it is determined that the differential input to the over-range stage will be negative ($Vres_{i-1}+$ is less than $Vres_{i-1}-$) at the beginning of the sample phase of the over-range stage 44, switches S1B, S2C and S3 are closed as are switches S1B', S2C' and S3'. The equivalent circuit is shown in FIG. 16A. Under these conditions, the differential input voltage is sampled on capacitors C1 and C1', with C2 and C2' being shorted.

Figure 16B:
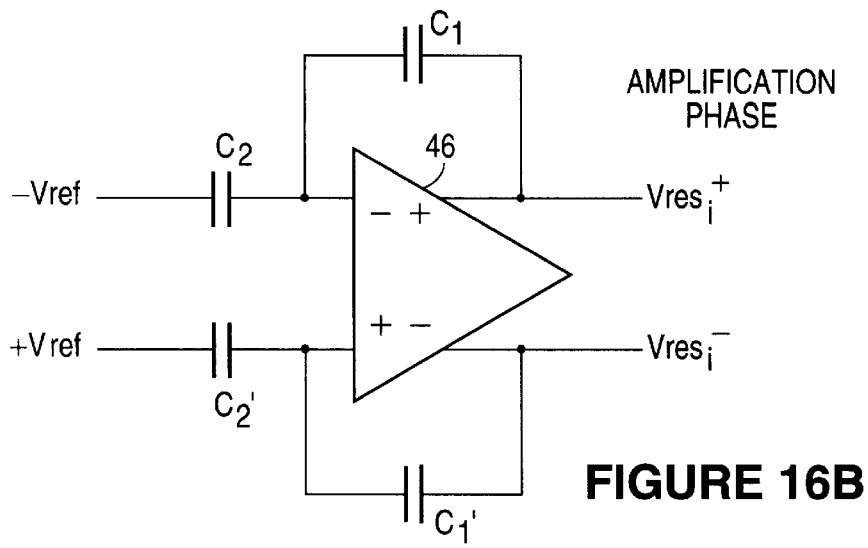

During the amplification phase ($Vref_{i-1}+$ is greater than $Vref_{i-1}-$), switches S1C, S2A, S1C' and S2A' are closed. The equivalent circuit is shown in FIG. 16B. This results in -Vref and +Vref being applied to capacitors C2 and C2', respectively, with capacitors C1 and C1' being connected in the feedback position. Using superposition, it can be seen that output voltage Vref+ can be determined using an expression similar to that shown in equation (9) and the output voltage Vref- can be determined using an expression similar to that shown in equation (8).

The differential output voltage is equal to the difference between Vref+ and Vref-. It can be seen that the magnitudes of output voltage $Vres_i+$ and $Vres_i-$ will both be less than that of Vref so that an over-range condition will not occur under expected worst case operating conditions. As was the case of the over-range circuit of FIG. 11, the feedback gain β remains at the relatively high value of ½.

Figure 16C:
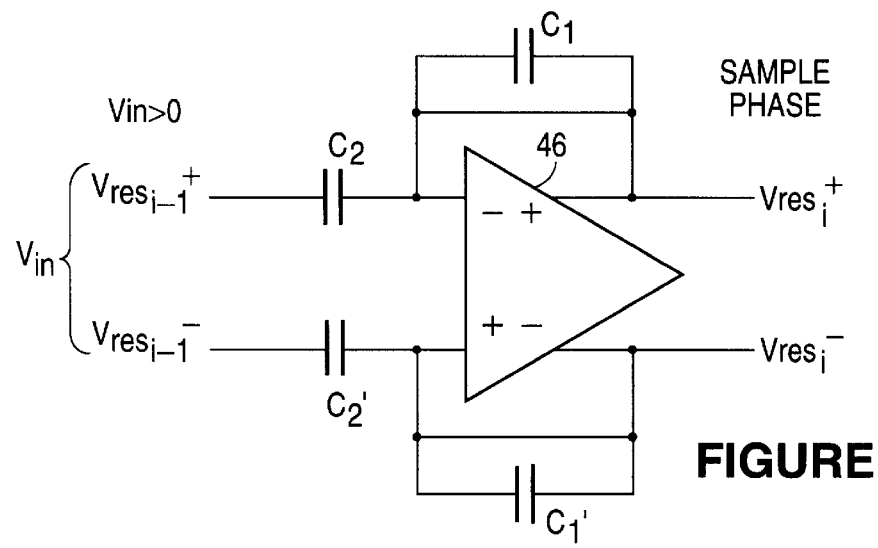

In the event the differential input voltage is positive ($Vres_{i-1}+$ is greater than $Vres_{i-1}-$), switches S1C, S2B, S3, S1C', S2B' and S3' are closed. As indicated by the equivalent circuit of FIG. 16C, inputs $Vres_{i-1}+$ and $Vres_{i-1}-$ are applied to capacitors C2 and C2', respectively. Capacitors C1 and C2 are shorted so that the input voltage will be stored on capacitors C2 and C2'.

Figure 16D:
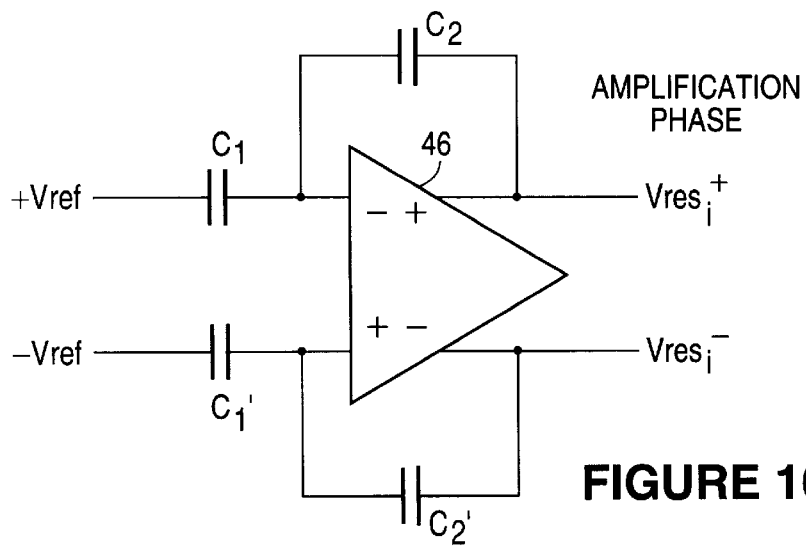

During the amplification phase where the input voltage is positive, switches S1A, S2C, S1A' and S2C' are closed. As can be seen from the equivalent circuit of FIG. 16D, voltage +Vref and -Vref are applied to capacitors C1 and C1', respectively, with capacitors C2 and C2 being connected in the feedback position. The output voltage Vres+ can then be determined using an equation similar to equation (9) and output voltage Vres- can be determined using an equation similar to equation (8). The differential voltage is equal to the difference. It can be seen that the magnitude of both $Vres_i+$ or $Vres_i-$ again will remain less than that of Vref for all worst case operating conditions so that over-ranging is eliminated.

As explained in the previously cited U.S. Pat. No. 5,668, 549, one or more of the FIG. 13 converter stages 40 with over-range correction can be positioned at appropriate spaced-apart locations of an algorithmic ADC so as to avoid over-range conditions under expected worst case operating conditions. The converter stages 40 will each either add or substrate one bit to the digital output associated with the stage so that digital correction can be easily carried out.

Comparing the performance of converter using the over-range circuit of FIG. 11 (and FIG. 15) in accordance with the present invention with a conventional converter using the conventional converter stage of FIG. 8, both approaches use the same number of capacitors and comparators. The approach of the subject invention does utilize an additional operational amplifier. However, the power dissipation and noise performance of the present invention are not degraded as compared to the prior art FIG. 8 approach notwithstanding the greater achievable operating speed as indicated by the following analysis.

The basic assumption of the following analysis is that, for a given operating speed, the power dissipation in an operational amplifier is directly proportional with its bandwidth. Also, for simplicity, all the parasitic capacitances are neglected and single gain stage amplifiers are considered, for which the transconductance is directly proportional to the power dissipation. It can be shown that, for single stage amplifier, the total input referred noise is proportional to kT/C where C is the total load capacitance.

Referring to the conventional converter stage of FIG. 8, it is assumed that all capacitors in the circuit equal to C and that there is a capacitive load for this stage equal to 2C'. C' might be smaller than C in pipeline designs allowing for stage to stage scaling. A good scaling rule is C'=0.7C. The total power dissipation is as follows:

$$P_I \propto 4 \cdot \left(2 \cdot C' + \frac{1}{4} \cdot C\right) = 8 \cdot C' + C = 6.6 \cdot C \qquad (12)$$

The number 4 in equation (12) is determined by the stage feedback gain.

The input referred noise of the conventional design during the sample phase is calculated as follows:

$$N_{I1} = \left(\frac{1}{4}\right) \cdot \frac{4 \cdot kT \cdot C}{C^2} = \frac{kT}{C} \qquad (13)$$

The input referred noise of the conventional design in the amplification phase is determined as follows:

$$N_{I2} = 2 \cdot \frac{16}{4} \cdot \frac{kT}{\left(2 \cdot C' + \frac{1}{4} \cdot C\right)} \qquad (14)$$

The factor of 16 of equation (14) is based upon the feedback gain and the factor of 4 is the nominal gain squared. The extra factor of 2 is a realistic approximation taking into account multiple noise sources in the operational amplifiers. The total noise of the conventional approach is given then by the following:

$$N_I = N_{I1} + N_{I2} \approx 5.85 \cdot \frac{kT}{C} \qquad (15)$$

In accordance with one embodiment of the present invention, the prior art over-range converter of FIG. 8, including the three comparators not depicted, has a nominal gain of 2 and is replaced with a one-bit converter stage 34 and an over-range stage 36 with a nominal gain of 1. The total power dissipation in the two operational amplifiers associated with stages 34 and 36 is determined by the following equation:

$$P_{II} \propto 2 \cdot \left(C + \frac{1}{2} \cdot C\right) + 2 \cdot \left(2 \cdot C' + \frac{1}{2} \cdot C\right) = 4 \cdot C' + 4 \cdot C \qquad (16)$$
$$= 6.8 \cdot C$$

The total input referred noise in the FIG. 13 approach, using the same simplifying assumptions as used in connection with the conventional approach, is as follows:

$$N_{II} = \qquad (17)$$

-continued $$kT \cdot \left( \frac{1}{4} \cdot \frac{2 \cdot C}{C^2} + \frac{4 \cdot 2}{4} \cdot \frac{1}{1.5 \cdot C} + \frac{1}{4} \cdot \frac{2 \cdot C}{C^2} + \frac{4 \cdot 2}{4} \cdot \frac{1}{2 \cdot C' + \frac{1}{2} \cdot C} \right) \approx$$

$$3.4 \cdot \frac{kT}{C}$$

By comparing equation (15) with equation (17), it can be seen that the total noise is significantly improved with essentially the same power dissipation as indicated by comparing equation (12) with equation (16). Thus, it is possible to obtain lower power dissipation using the approach of the present invention by reducing the size of the capacitors while providing the same noise performance. In a realistic design, however, other effects, such as slew rate and parasitic capacitances, have to be taken into account. However, this simplified first order analysis indicates that the present invention makes it possible to obtain both a lower noise and a lower power dissipation as compared with prior art implementations.

Thus, a novel analog to digital converter architecture and method have been disclosed. Although one implementation has been described in some detail, it is to be understood that changes can be made by those skilled in the art without departing from the spirit and scope of the invention as defined by the appended claims.

What is claimed is:

1. An analog to digital converter section comprising:
   a converter stage configured to receive an analog input voltage and to produce a converter stage output indicative of the analog input voltage, with the converter stage output including a digital output and a first residue analog voltage output; and
   an over-range stage including an amplifier which produces a second residue analog voltage voltage output, and first and second capacitors, with the over-range stage switchable between a sample phase and an amplification phase, with the over-range stage being configured when in the sample phase to connect the first capacitor, and not the first capacitor, to receive the first residue analog voltage when the first residue analog voltage is in a first state and configured to connect the second capacitor, and not the first capacitor, to receive the first residue analog voltage when the first residue voltage is in a second state different from the first state.

2. The analog to digital converter section of claim 1 wherein the over-range stage is further configured when in the amplification phase to connect the second capacitor to receive a first reference voltage and to connect the first capacitor to a feedback position relative to the amplifier when the first residue analog voltage is in the first state and to connect the first capacitor to receive a second reference voltage, different from the first reference voltage, and to connect the second capacitor to the feedback position relative to the amplifier when the first residue voltage is in the second state.

3. The analog to digital converter section of claim 2 wherein the amplifier is a fully differential amplifier having first and second differential inputs and first and second differential outputs and wherein the over-range stage further includes third and fourth capacitors and is further configured when in the sample phase to connect the third capacitor to receive the first residue analog voltage when the first residue analog voltage is in the first state and configured to connect the fourth capacitor to receive the first residue analog voltage when the first residue analog voltage is in the second state.

4. The analog to digital converter section of claim 3 wherein the over-range stage is further configured when in the amplification phase to connect the fourth capacitor to receive the second reference voltage and to connect the third capacitor to the feedback position relative to the amplifier when the first residue analog voltage is in the first state and to connect the third capacitor to receive the first reference voltage and to connect the fourth capacitor to the feedback position relative to the amplifier when the first residue analog voltage is in the second state.

5. The analog to digital converter section of claim 4 wherein the first residue analog voltage is in the first state when the first residue analog voltage is of a first polarity and in the second state when the first residue analog voltage is of a second polarity, opposite the first polarity.

6. The analog to digital converter section of claim 5 further comprising detection circuitry configured to determine the polarity of the first residue analog voltage based upon the state of the analog input voltage applied to the converter stage.

7. The analog to digital converter section of claim 6 wherein the first and second reference voltages are of a same magnitude and are of opposite polarity.

8. An analog to digital converter section comprising:
   a converter stage configured to receive an analog input voltage and to produce a converter stage output indicative of the analog input voltage, with the converter stage output including a digital output and a first residue analog voltage output; and
   an over-range stage including an amplifier, first and second capacitors and switching circuitry switchable among first, second, third and fourth modes, with the first mode connecting the first capacitor, and not the second capacitor, between an inverting amplifier input and the first residue analog voltage output and connecting an output of the amplifier to the inverting amplifier input, the second mode connecting the first capacitor between the amplifier output and the inverting amplifier input and connecting the second capacitor between the inverting amplifier input and a source of a first reference voltage, the third mode connecting the second capacitor, and not the first capacitor, between the first residue analog voltage output and the inverting amplifier input and connecting an output of the amplifier to the inverting amplifier input, and the fourth mode connecting the first capacitor between the inverting amplifier input and a source of a second reference voltage and connecting the second capacitor between the inverting amplifier input and the amplifier output.

9. The analog to digital converter section of claim 8 further comprising control circuitry configured to monitor the analog input voltage to the converter stage and to cause the switching circuitry to switch between the first and third modes.

10. The analog to digital converter section of claim 9 wherein the feedback gain associated with the amplifier when the switching circuitry is in the second and third mode is approximately ½.

11. The analog to digital converter section of claim 10 wherein the amplifier is a fully differential amplifier having first and second differential inputs and first and second differential outputs and wherein the over-range stage further comprises third and fourth capacitors and wherein the switching circuitry in the first mode connecting the first capacitor between the first differential input and the converter output, connecting the first differential output to the first differential input, connecting the third capacitor between the second differential input and the converter stage output and connecting the second differential output to the second differential input, in the second mode connecting the second capacitor between the source of the first reference voltage and the first differential input, the first capacitor between the first differential input and the first differential output, the fourth capacitor between the source of the second reference voltage and the second differential input and the third capacitor between the second differential input and the second differential output.

12. The analog to digital converter section of claim 11 wherein the switching circuitry in the third mode connecting the second capacitor between the converter stage output and the first differential input, connecting the first differential input to the first differential output, connecting the fourth capacitor between the converter stage output and the second differential input and connecting the second differential input to the second differential output and in the fourth mode connecting the first capacitor between the source of the second reference voltage and the first differential input and connecting the second capacitor between the first differential input and the first differential output, connecting the third capacitor between the source of the first reference voltage and the second differential input and connecting the fourth capacitor between the second differential input and the second differential output.

13. A method of reducing over-range conditions in an algorithmic ADC comprised of a plurality of converter stages, with each of the converter stages alternating between a sample phase and an amplification phase, said method comprising the following steps:

predicting, prior to an end of the amplification phase of a first one of the converter stages, whether a first residue voltage of the first converter stage will be in a first voltage range or a second voltage range at the end of the amplification phase of the first converter stage;

sampling the first residue voltage output of the first converter stage after an end of the amplification phase of the first converter stage to produce a sampled voltage;

combining a first reference voltage with the sampled voltage in the event the step of predicting establishes that the first residue voltage is in the first voltage range so as to produce a second residue voltage;

combining a second reference voltage, different than the first reference voltage, in the event the step of predicting establishes that the first residue voltage is in the second voltage range so as to produce the second residue voltage; and forwarding the second residue voltage to a second one of the converter stages.

14. The method of claim 13 wherein the first and second voltage ranges of the first residue voltage correspond to voltages of opposite polarity.

15. The method of claim 14 wherein the first and second reference voltages are of equal magnitude and opposite polarity.

16. The method of claim 15 wherein the step of predicting is carried out by monitoring a analog input voltage applied to the first converter stage.

17. The method of claim 16 wherein step of sampling the first residue voltage includes the step of applying the first residue voltage to a first capacitor, and not a second capacitor, in the event the step of predicting indicates that the first residue output voltage will be in the first voltage range and to the second capacitor in the event the step of predicting indicates that the first residue voltage will be in the second voltage range.

18. A method of reducing over-range conditions in an algorithmic ADC comprised of a plurality of converter stages, with each of the converter stages alternating between a sample phase and an amplification phase, said method comprising the following steps:

sampling a first residue voltage produced by the first converter stage on a first capacitor, and not a second capacitor, in the event the first residue voltage is of a first polarity;

sampling the first residue voltage on the second capacitor, and not the first capacitor, in the event the first residue voltage is of a second polarity opposite the first polarity;

subtracting a first reference voltage from the first residue voltage in the event the first residue voltage was sampled on the first capacitor to produce a second residue voltage;

subtracting a second reference voltage from the first residue voltage in the event the first residue voltage was sampled on the second capacitor to produce the second residue voltage; and forwarding the second residue voltage to a subsequent one of the converter stages.

19. The method of claim 18 wherein the first and second reference voltages are of an equal magnitude and opposite polarity.

20. The method of claim 19 wherein the step of subtracting the first reference voltage includes the step of connecting the second reference voltage to the second capacitor and wherein the step of subtracting the second voltage includes the step of connecting the first reference voltage to the first capacitor.

* * * * *